(12) United States Patent
Lazur et al.

(10) Patent No.: US 9,758,436 B2
(45) Date of Patent: *Sep. 12, 2017

(54) RAPID CERAMIC MATRIX COMPOSITE PRODUCTION METHOD

(71) Applicant: Rolls-Royce Corporation, Indianapolis, IN (US)

(72) Inventors: Andrew J. Lazur, Huntington Beach, CA (US); Adam L. Chamberlain, Mooresville, IN (US)

(73) Assignee: Rolls-Royce Corporation, Indianapolis, IN (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/336,176

(22) Filed: Oct. 27, 2016

(65) Prior Publication Data

US 2017/0044071 A1 Feb. 16, 2017

Related U.S. Application Data

(63) Continuation of application No. 14/140,661, filed on Dec. 26, 2013, now Pat. No. 9,523,149.

(60) Provisional application No. 61/794,034, filed on Mar. 15, 2013, provisional application No. 61/783,440, filed on Mar. 14, 2013.

(51) Int. Cl.
| | |
|---|---|
| *C23C 16/00* | (2006.01) |
| *C04B 35/80* | (2006.01) |
| *C04B 35/573* | (2006.01) |
| *C04B 35/628* | (2006.01) |
| *C23C 16/32* | (2006.01) |
| *C23C 16/34* | (2006.01) |
| *C23C 16/04* | (2006.01) |

(52) U.S. Cl.
CPC .......... *C04B 35/806* (2013.01); *C04B 35/573* (2013.01); *C04B 35/6286* (2013.01); *C04B 35/62863* (2013.01); *C04B 35/62868* (2013.01); *C04B 35/62873* (2013.01); *C04B 35/62884* (2013.01); *C04B 35/62894* (2013.01); *C04B 35/62897* (2013.01); *C23C 16/045* (2013.01); *C23C 16/32* (2013.01); *C23C 16/325* (2013.01); *C23C 16/342* (2013.01); *C04B 2235/3826* (2013.01); *C04B 2235/421* (2013.01); *C04B 2235/422* (2013.01); *C04B 2235/5244* (2013.01); *C04B 2235/5248* (2013.01); *C04B 2235/614* (2013.01); *C04B 2235/616* (2013.01)

(58) Field of Classification Search
CPC ...... C23C 16/342; C23C 16/325; C23C 16/32
USPC ........................ 427/255.38, 255.28
See application file for complete search history.

(56) References Cited

U.S. PATENT DOCUMENTS

| | | |
|---|---|---|
| 5,022,343 A | 6/1991 | Fujikawa et al. |
| 5,125,822 A | 6/1992 | Kasprzyk |
| 5,137,755 A | 8/1992 | Fujikawa et al. |
| 5,202,158 A | 4/1993 | Sakagami et al. |
| 5,547,628 A | 8/1996 | Lacombe |

(Continued)

OTHER PUBLICATIONS

Besmann et al. Fabrication of ceramic composites: forced CVI, 1995, J. Nuc. Mater. 219 pp. 31-35.*

(Continued)

*Primary Examiner* — Kelly M Gambetta
(74) *Attorney, Agent, or Firm* — Brinks Gilson & Lione

(57) ABSTRACT

Ceramic matrix composite materials and a process for making said composite materials are disclosed.

19 Claims, 3 Drawing Sheets

(56) References Cited

U.S. PATENT DOCUMENTS

| | | | |
|---|---|---|---|
| 6,495,204 | B1 | 12/2002 | Allen et al. |
| 6,780,462 | B2 | 8/2004 | Purdy et al. |
| 6,942,893 | B2 | 9/2005 | Delperier et al. |
| 6,953,605 | B2 | 10/2005 | Sion et al. |
| 7,052,643 | B2 | 5/2006 | Sion |
| 7,318,717 | B2 | 1/2008 | Wood et al. |
| 7,763,224 | B2 | 7/2010 | Kienzle et al. |
| 8,084,079 | B2 | 12/2011 | Thebault et al. |
| 9,523,149 | B2 * | 12/2016 | Lazur .................. C23C 16/342 |
| 2004/0192534 | A1 | 9/2004 | Nixon et al. |
| 2011/0027098 | A1 * | 2/2011 | Noe ..................... C04B 35/573 |
| | | | 416/241 B |
| 2012/0076927 | A1 | 3/2012 | Bhatt et al. |
| 2013/0084189 | A1 * | 4/2013 | Diego .................. C04B 37/001 |
| | | | 416/241 B |

OTHER PUBLICATIONS

Gulden et al.; "Forced-Flow Thermal-Gradient Chemical Vapor Infiltration (CVI) of Ceramic Matrix Composites"; Proceedings of the Electrochemical Society, vol. 90, No. 12; Jan. 1, 1990; pp. 546-552.

Igawa, et al.; "Optimizing the Fabrication Process for Superior Mechanical Properties in the FCVI SIC Matrix/Stoichiometric SiC Fiber Composite System"; Journal of Nuclear Materials, vols. 307-311, Part 2; Dec. 2002; pp. 1205-1209.

International Search Report for International Application No. PCT/US2014/022389 completed Mar. 10, 2014.

* cited by examiner

US 9,758,436 B2

RAPID CERAMIC MATRIX COMPOSITE PRODUCTION METHOD

CROSS REFERENCE TO RELATED APPLICATIONS

The present patent document is a continuation of U.S. patent application Ser. No. 14/140,661, filed Dec. 26, 2013, which claims the benefit of the filing date under 35 U.S.C. 119(e) to U.S. Provisional Patent Application No. 61/783,440, filed Mar. 14, 2013, and to U.S. Provisional Patent Application No. 61/794,034, filed Mar. 15, 2013. All of the foregoing patent documents are hereby incorporated by reference in their entirety.

FIELD OF THE DISCLOSURE

The present disclosure related generally to composite materials, and more specifically to a process for making composite materials.

BACKGROUND

Gas turbine engines are used to power aircraft, watercraft, power generators, and the like. Gas turbine engines typically include a compressor, a combustor, and a turbine. The compressor compresses air drawn into the engine and delivers high pressure air to the combustor. In the combustor, fuel is mixed with the high pressure air and is ignited. Products of the combustion reaction in the combustor are directed into the turbine where work is extracted to drive the compressor and, sometimes, an output shaft. Left-over products of the combustion are exhausted out of the turbine and may provide thrust in some applications.

Economic and environmental concerns related to gas turbine engines, i.e. improving efficiency and reducing emissions, are a driving force behind increasing demand for components that can withstand higher temperature environments. A limitation to the efficiency and emissions of many gas turbine engines is the temperature capability of hot section components (for example, but not limited to turbine blades, turbine vanes, turbine blade tracks, and combustor liners). Technology improvements in cooling, materials, and coatings are required to achieve higher allowable temperatures for hot section components. High temperature materials, such as ceramic-based materials, may be excellent materials for use in gas turbines.

SUMMARY

The present application discloses one or more of the features recited in the appended claims and/or the following features which, alone or in any combination, may comprise patentable subject matter.

A method of producing a ceramic matrix composite may include steps of
a) applying a fiber interface coating to the composite, b) coating the composite via chemical vapor infiltration, and c) infiltrating the composite with molten material.

In some embodiments, the steps (a), (b), and (c) are performed during a single furnace cycle.

In some embodiments, steps (a) and (b) may both independently be forced flow processes.

In some embodiments, the forced flow processes can apply a pressure gradient of about 0.005 atm to about 1.0 atm.

According to another aspect of the present disclosure, a fiber interface coating can include carbon, boron nitride or silicon doped boron nitride.

In some embodiments, a coating by chemical vapor infiltration can include silicon carbide, silicon nitride carbide, boron carbide, or carbon. A coating can be about 0.1 μm to about 15.0 μm.

In some embodiments, a ceramic matrix composite is multi-layered.

In some embodiments, at least one layer of a ceramic matrix composite includes at least one of a carbide, boride, nitride, or carbon. In an embodiment, at least one layer of a ceramic matrix composite is silicon carbide. In an embodiment, at least one layer of a ceramic matrix composite is boron nitride.

These and other features of the present disclosure will become more apparent from the following description of the illustrative embodiments.

DETAILED DESCRIPTION OF THE DRAWINGS

Figure 1:
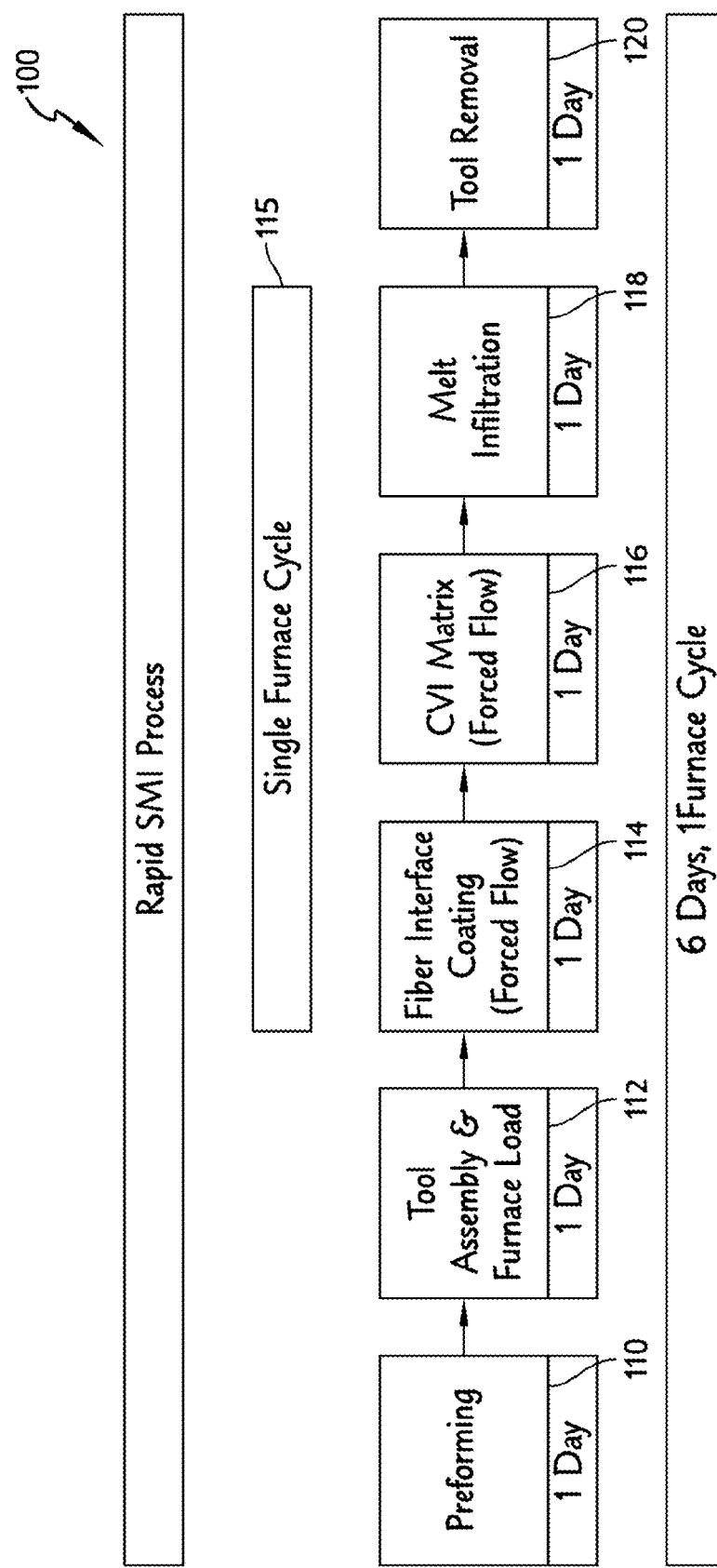
FIG. 1 is a flow chart outlining a rapid matrix densification process for ceramic matrix composites.
Figure 2:
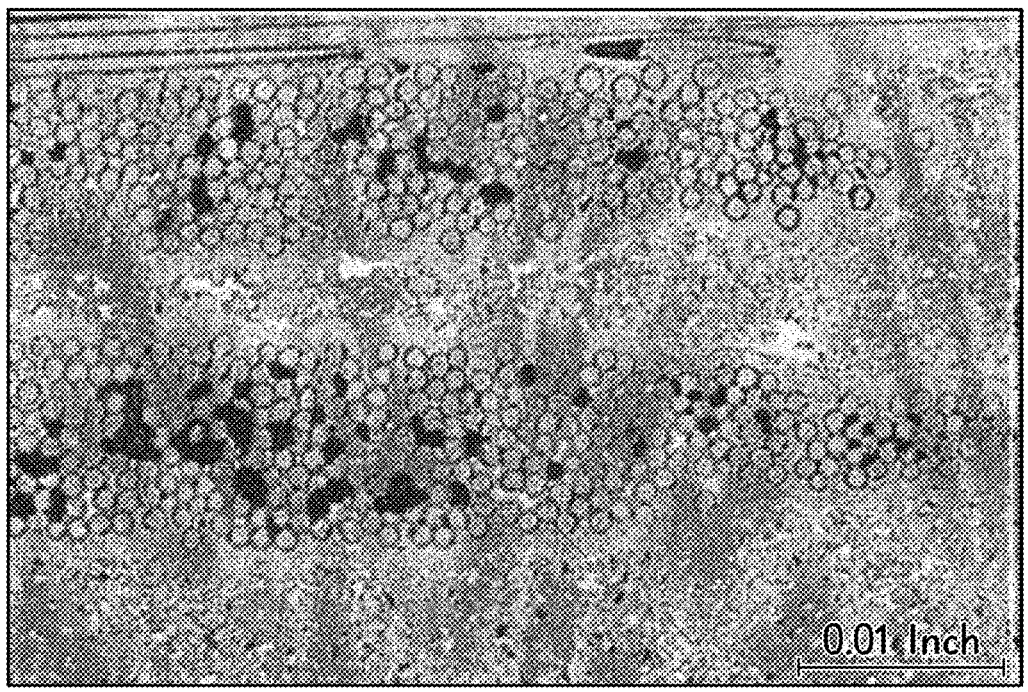
FIG. 2 is a typical cross section of a SMI composite wherein the CVI process coats all fibers and ultimately closes all porosity within the bundle producing a solid coating on the outside of the bundle, black regions indicate porosity.

For the purposes of promoting an understanding of the principles of the disclosure, reference will now be made to a number of illustrative embodiments illustrated in the drawings and specific language will be used to describe the same.

Described herein is a method for a rapid matrix densification process for ceramic matrix composites (CMCs) production (FIG. 1). Total duration of process described herein is about 6 days. The process may be less than 6 days. In an embodiment, a rapid process can be complete in one furnace cycle. In an embodiment, a rapid process can be complete in two or three furnace cycles. Some SMI processes require 15 to 36 days and 3 to 5 furnace cycles. In the methods described herein, gas exhaust remains unchanged during furnace assembly. Rapid tools as described herein can be connected to a line that feeds gas or liquid.

FIG. 1 is a flow chart depicting a rapid matrix densification process 100 for ceramic matrix composites (CMCs) production. Embodiments of methods disclosed herein require about 6 days and one furnace cycle. A first step 110 in the process 100 is preforming a composite material component by laying up layers of fiber-reinforced fabrics, arranging fiber tows, or forming fibers (random or directional) into a predetermined shape.

Figure 4:
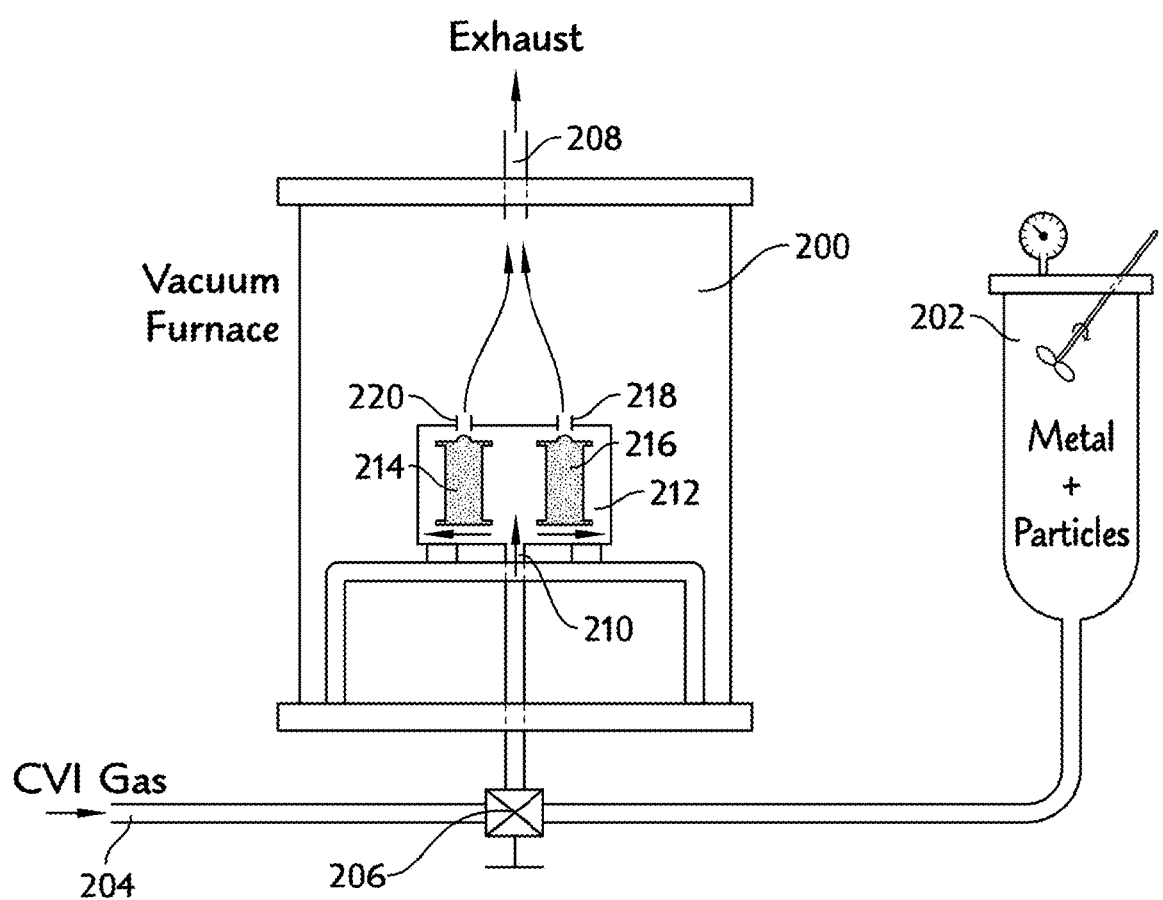
FIG. 4 is a schematic depicting the processing equipment for one embodiment that includes a slurry tank 202, a gas inlet 204, a valve 206, a furnace exhaust 208, a tool inlet 210, a tool 212, a part 214, a part 216, a tool exhaust 218, and a tool exhaust 220.

Next the process includes a step 112 of tooling as shown in FIG. 1. Step 112 includes coupling at a minimum one inlet and one outlet for gas/liquid to the die. Manifolding and distribution may vary depending upon the part geometry and the number of parts in one tool. Such a tool may be a multi-piece tool a suggested in FIG. 4. A tool may also be a single piece tool with allowances for part extraction (e.g., draft angle) or destruction upon part completion. A tool may also be capable of being assembled and/or disassembled. A surface of a part may be solid and smooth.

In another step 114 of the process 100, a fiber interface is coated through the forced flow of gas as shown in FIG. 1. In some embodiments, a pressure gradient introduces gas reactants to deposit the fiber interface. A gas reactant in this step can be, but not limited to, carbon, boron nitride, silicon doped boron nitride. In some embodiments, the gas is evenly distributed and flows through the preform to provide a uniform coating thickness of the fibers, including thick parts. The pressure gradient can be about 0.001 to about 1.5 atm, about 0.005 to about 1.5 atm, about 0.01 to about 1.5 atm, about 0.001 to about 1.25 atm, about 0.005 to about 1.25 atm, about 0.01 to about 1.25 atm, about 0.001 to about 1.0 atm, about 0.005 to about 1.0 atm, about 0.01 to about 1.0 atm, about 0.001 to about 0.9 atm, about 0.005 to about 0.9 atm, about 0.01 to about 0.9 atm, about 0.001 to about 0.8 atm, about 0.005 to about 0.8 atm, about 0.01 to about 0.8 atm, about 0.001 to about 0.75 atm, about 0.005 to about 0.75 atm, or about 0.01 to about 0.75 atm.

In another step 116, a pressure gradient is also used to introduce gas reactants to deposit compositions on the fibers through chemical vapor infiltration (CVI). Multiple compositions may be applied including, but not limited to, silicon carbide, silicon nitride carbide (SiNC), boron carbide (B4C), and carbon. The pressure gradient can be about 0.001 to about 1.5 atm, about 0.005 to about 1.5 atm, about 0.01 to about 1.5 atm, about 0.001 to about 1.25 atm, about 0.005 to about 1.25 atm, about 0.01 to about 1.25 atm, about 0.001 to about 1.0 atm, about 0.005 to about 1.0 atm, about 0.01 to about 1.0 atm, about 0.001 to about 0.9 atm, about 0.005 to about 0.9 atm, about 0.01 to about 0.9 atm, about 0.001 to about 0.8 atm, about 0.005 to about 0.8 atm, about 0.01 to about 0.8 atm, about 0.001 to about 0.75 atm, about 0.005 to about 0.75 atm, or about 0.01 to about 0.75 atm.

Figure 3:
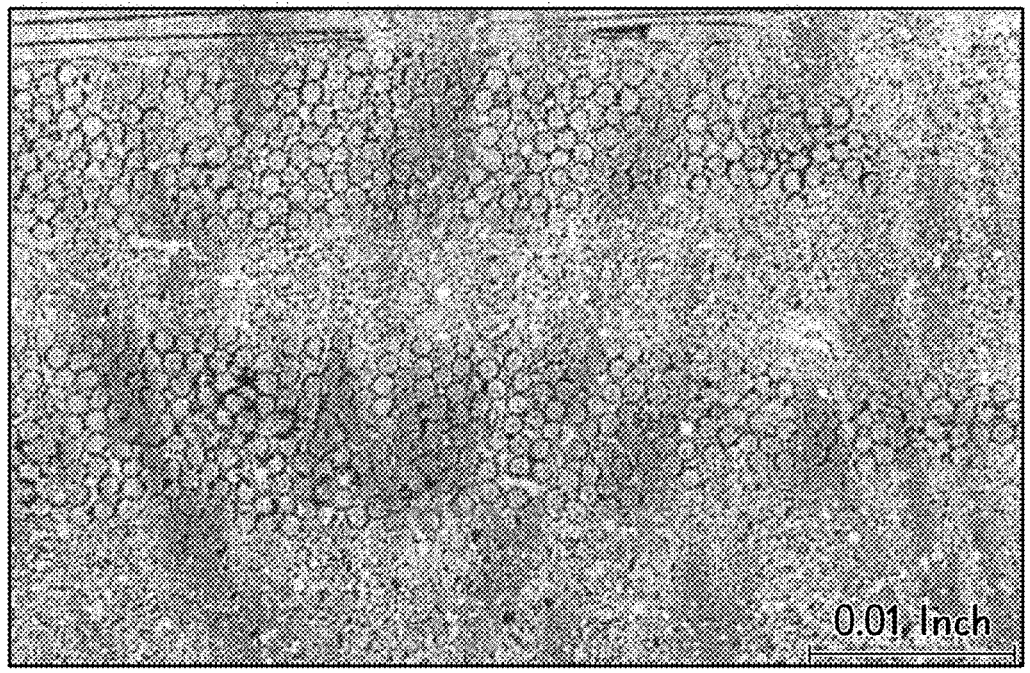
FIG. 3 is a cross section of a SMI composite produced by the process described herein in which most or all of this porosity will remain open because the deposition thickness will be much lower.

The thickness of the coating can be from about 0.1 to about 15.0 µm. The thickness of the coating can be about 0.1 to about 10.0 µm, 0.1 to about 9.0 µm, 0.1 to about 8.0 µm, 0.1 to about 7.0 µm, 0.1 to about 6.0 µm, 0.1 to about 5.0 µm, 0.1 to about 4.0 µm, 0.1 to about 3.0 µm, 0.1 to about 2.0 µm, or 0.1 to about 1.0 µm. Lower deposition thickness provides more open porosity of the composite (FIG. 3). In an embodiment, the gas is evenly distributed and flow through the preform to provide a uniform coating thickness of the fibers, including thick parts. The forced flow of gas increases the deposition rate while maintaining or improving the uniformity of deposition.

Another step 118 of the process 100 is melt infiltration as shown in FIG. 1. During the step of melt infiltration, the tool is heated to above the melting point of a material used for infiltration (e.g., silicon and above 1400° C.). The material may also be an alloy of elements. The material may also react with some or all of the components of the tool. During the melt infiltration, the furnace inlet is temporarily closed by a valve and connected to a supply of molten material. The molten material can comprise silicon carbide, carbon, or other ceramic particulate(s).

Thereby, a part tool is filled with liquid metal and/or particulate through application of pressure to the liquid metal vessel during the melt infiltration. The part tool can contain a material in an outlet that allows gas flow but blocks particulate and/or reacts with the molten material to create a seal. A pressure increase indicates metal infiltration process completion. In another embodiment, a known volume transfers to the part tool to indicate process completion of the metal infiltration. In yet another embodiment, a mass measurement can indicate when the metal infiltration process is complete. The furnace is then cooled. Once the tool part drops below the solidification temperature, the remaining liquid in the feed line is retracted by a vacuum accompanied by an inert gas purge. The gas purge can be ported into a feed line.

In the illustrative embodiment, the steps 114, 116, and 118 may be performed as part of a single furnace cycle 115 as shown in FIG. 1. By combining steps 114, 116, 118 into a single furnace cycle 115, the time required to complete process 100 may be reduced and/or products of the process may be of high (and consistent) quality.

A final step 120 of the process 100 is removal of the tooling from the composite component as shown in FIG. 1. Some molten metal will exist in feed lines and possibly exhaust ports. This remaining molten metal requires trimming. The tooling may be designed with a lower coefficient of thermal expansion (CTE). The lower CTE enables the part to shrink away from the tool surface to ease part removal. A multi-piece tool can be disassembled and reconditioned for reuse. A single piece tool can be extracted for reconditioning and reuse. A single piece tool can also be destroyed by machining, grinding, rapid oxidation, grit blasting, or other means of destruction. In an embodiment, a near net or net part with only a need for inlet/outlet machining is produced.

Optionally, the tool part can be removed from the process after the CVI processing step 116 (FIG. 1) for outside slurry infiltration and then the tool part is returned to the furnace for melt infiltration. This optional step has advantages for adding reactive element(s), different particulate sizes, and variations in fillers within the composite by controlled localized infiltration among others. This additional step would require additional time and additional furnace time in particular. A difference between this process and the typical process is that the part is not necessarily removed from the tool to accomplish the slurry infiltration. This difference allows the use of very thin CVI depositions to leave all of the porosity in the composite open.

The ceramic matrix composite produced by the process 100 may be multi-layered. Multiple layers may include carbides, borides, nitrides, and carbon. A carbide includes, but is not limited to, silicon carbide. A nitride includes, but is not limited to, boron nitride.

Methods for a rapid matrix densification process for ceramic matrix composites (CMCs) production as described herein has many advantages compared to typical SMI processes. Advantages of the disclosed methods include:

(a) improved proportional limit strength resulting from decreased level of defects and an increase in matrix material;

(b) improved interlaminar tensile strength by as much as 100-150% as a result of reduction in defects and an increase in matrix levels overall;

(c) reduced porosity resulting in longer component life because steam and oxygen will not flow in a network of "closed" porosity that is either open in a limited way or becomes open during component life;

(d) typical SMI matrix has some porosity because of the nature of the capillary driven infiltration, the molten metal/slurry injection should reduce this porosity source as well resulting in improved properties;

(e) reduced cost resulting from the simplification of the process and reduction in process cycle times;

(f) reduced cycle time resulting in decreased capital requirements;

(g) improved part surface finish by elimination of holes typically used in CVI;

(h) improved part surface finish by filling of preform texture with slurry/metal. (500 µin RMS to 50 µin RMS or better);

(i) reduced machining requirements for sealing and attachment surfaces;

(j) reduced sensitivity to thick cross sections and complex shapes;

(k) improved uniformity of the CVI deposits; and (l) reduction in porosity greatly reduces the opportunity for liquids (fuel, oil, water etc.) to absorb in the material during engine dormancy that might result in high stress levels during engine start up.

The disclosed method reduces CVI deposition requirements because a part is maintained within a tool through slurry infiltration and melt infiltration. In an embodiment, a part is not removed from the tool between processes. In an embodiment, a part is not removed from the tool between fiber interface coating, CVI and melt infiltration. In an embodiment, a part is not removed from the tool between CVI and melt infiltration. In an embodiment, a part is not removed from the tool between fiber interface coating and CVI. Since a part may be maintained within a common tool through slurry infiltration and melt infiltration, the part can possess improved geometric fidelity. In an embodiment, a part is not removed from a tool between fiber interface coating, CVI and melt infiltration, and the process is completed in one furnace cycle. In an embodiment, a part is not removed from a tool between fiber interface coating, CVI and melt infiltration, and the process is completed in two or three furnace cycles. In an embodiment, steps 110, 112, 114, 116, 118, and 120 are completed wherein a part is not removed from a tool. In an embodiment, methods as disclosed herein could include producing a single part from a single tool and a single preform. In an embodiment, methods as disclosed herein could include producing multiple parts from batch processing.

In an embodiment, a common tool 212 can be used in any and up to all of the steps in the production of a part. A common tool 212 can be used in both the CVI and melt infiltration processes. In an embodiment, a common tool 212 remains in the furnace 200 during all of the process steps. In an embodiment, a common tool 212 can be removed from a furnace 200 between process steps (e.g., periodic removal) but the common tool is still used in the process steps (e.g., CVI, melt infiltration, etc.). In an embodiment, a tool 212 can include an inlet 210 and an outlet 218. In an embodiment, a tool inlet 210 can accommodate the intake of gas (e.g., during CVI) and molten material (e.g., molten silicon). A common tool 212 can contain a part 212 or 214, wherein the same tool can be used for multiple process steps so that a part does not need to be removed when applying a coating, e.g., a slurry 202 or gas 204.

In some embodiments, binders are selected and used in order to allow tool removal after slurry infiltration. The reduction of CVI deposition results in improved microstructure of the finished part. Additionally predetermined mechanical properties can be produced as a result of reduced CVI content.

The disclosed process may be performed in production of a single part allowing for single-piece or small batch production. Such production can be desirable and can reduce work in process.

EXAMPLES

Example 1: SiC/SiC CMC

A Hi-Nicalon preform was constructed at 36% fiber volume and assembled in tooling with smooth surfaces that was coated with SiC and BN by CVD to create a vane for a turbine engine. The tool inlet promoted uniform gas distribution across the fiber preform and was connected to a leak tight tube that passes through the vacuum furnace.

A boron nitride (BN) interface coating was applied at 0.5 µm at an internal part pressure of 50 torr and a furnace pressure of 10 torr creating a constant flow through the preform.

A SiC coating of 0.3 µm was applied using typical CVI chemistry.

A B4C coating of 0.2 µm was applied using typical CVI chemistry.

A carbon coating of 0.2 µm was applied using typical CVI chemistry.

The preform and tool remained in the furnace and was heated to 1450° C.

A tank containing an alloy of Si, B and C along with SiC particulate ranging from 0.1 to 5 µm was heated to 1450° C. A metered volume of this mixture was injected under pressure into the preform to complete part densification.

The resulting composite had uniform infiltration and microstructure.

Example 2: SiC/SiC CMC

A Tyranno SA preform was constructed at 30% fiber volume and assembled in tooling with smooth surfaces that was coated with SiC and BN by CVD to create a seal segment for a turbine engine. The tool inlet promoted uniform gas distribution across the fiber preform and was connected to a leak tight tube that passes through the vacuum furnace.

A silicon doped multi-layered boron nitride (BN) interface coating is applied at 0.5 µm at an internal part pressure of 100 torr and a furnace pressure of 20 torr creating a constant flow through the preform.

A SiC coating of 0.2 µm was applied using typical CVI chemistry.

A B4C coating of 0.1 µm was applied using typical CVI chemistry.

A carbon coating of 0.3 µm was applied using typical CVI chemistry.

The preform and tool were cooled and removed from the furnace.

The part was vacuum infiltrated with a particulate slurry containing SiC and carbon particles.

The infiltrated part was dried in a vacuum oven at 200° C. for 24 hours.

Silicon powder was loaded into a cavity near the outlet of the tooling designed for this purpose. The Si made end contact to the preform inside the tool. The inlet of the tool was capped with a graphite plug.

The assembly was heated in a vacuum furnace to 1470° C. and held for 12 hours prior to cooling.

The part was removed from the tool and machined in the inlet and outlet zones.

The resulting composite had uniform infiltration and microstructure.

Example 3: C/B4C/SiC CMC

A T600 carbon fiber preform was constructed at 30% fiber volume and assembled in tooling with smooth surfaces that was coated with SiC and BN by CVD to create a seal segment for a turbine engine. The tool inlet promoted uniform gas distribution across the fiber preform and was connected to a leak tight tube that passes through the vacuum furnace.

A carbon interface coating was applied at 0.5 μm at an internal part pressure of 50 torr and a furnace pressure of 10 torr creating a constant flow through the preform.

Alternating layers of B4C and SiC are deposited in 0.1 μm thickness until a total of 1.2-1.4 μm was applied using typical CVI chemistry.

A carbon coating of 0.1 μm is applied using typical CVI chemistry.

The preform and tool remained in the furnace and was heated to 1450° C.

A tank containing an alloy of Si, B and C along with SiC particulate ranging from 0.1 to 5 μm was heated to 1450° C. A metered volume of this mixture was injected under pressure into the preform to complete part densification.

The resulting composite had uniform infiltration and microstructure. While the disclosure has been illustrated and described in detail in the foregoing drawings and description, the same is to be considered as exemplary and not restrictive in character, it being understood that only illustrative embodiments thereof have been shown and described and that all changes and modifications that come within the spirit of the disclosure are desired to be protected.

What is claimed is:

1. A method of rapidly densifying a ceramic matrix composite, the method comprising:
    enclosing a fiber preform within a tool comprising a tool inlet and a tool outlet;
    loading the tool into a furnace;
    connecting to the tool inlet to a feed line for delivery of a gas or liquid into the tool;
    flowing a first gas through the feed line and into the tool, the first gas being evenly distributed through the fiber preform and first gas reactants being deposited on fibers of the fiber preform as a fiber interface coating, thereby forming a coated fiber preform;
    flowing a second gas through the feed line and into the tool, the second gas being evenly distributed through the coated fiber preform and second gas reactants being deposited on fibers of the coated fiber preform as a CVI matrix coating, thereby forming a CVI coated fiber preform;
    flowing a molten material through the feed line and into the tool for melt infiltration of the CVI coated fiber preform; and
    cooling the furnace, the tool dropping below a solidification temperature of the molten material, thereby rapidly densifying a ceramic matrix composite.

2. The method of claim 1, wherein the fiber interface coating and the CVI matrix coating are formed without removing the tool from the furnace.

3. The method of claim 1, wherein the CVI matrix coating is formed and the melt infiltration is carried out without removing the tool from the furnace.

4. The method of claim 1 wherein the fiber interface coating and the CVI matrix coating are formed and the melt infiltration is carried out without removing the tool from the furnace.

5. The method of claim 1, further comprising infiltrating the CVI coated fiber preform with a slurry.

6. The method of claim 5, wherein infiltration with the slurry takes place without removing the tool from the furnace.

7. The method of claim 5, wherein infiltration with the slurry takes place during the melt infiltration, the molten material including particles.

8. The method of claim 1, wherein the tool is heated to a temperature above a melting point of the molten material during the melt infiltration.

9. The method of claim 1, further comprising, after the cooling, removing the tool from the ceramic matrix composite.

10. The method of claim 1, wherein the flowing of the first gas is carried out with a pressure gradient of from about 0.001 atm to about 1.5 atm.

11. The method of claim 1, wherein the fiber interface coating comprises carbon, boron nitride, or silicon doped boron nitride.

12. The method of claim 1, wherein the flowing of the second gas is carried out with a pressure gradient of from about 0.001 atm to about 1.5 atm.

13. The method of claim 1, wherein the CVI matrix coating comprises silicon carbide, silicon nitride carbide, boron carbide, or carbon.

14. The method of claim 1, wherein the tool is a multi-piece tool.

15. The method of claim 1, wherein the tool is a single piece tool.

16. The method of claim 1, wherein a valve attached to the feed line separates a gas source from a liquid source.

17. The method of claim 1, wherein the tool outlet contains a material that allows gas flow but blocks particulate and/or reacts with molten material to create a seal.

18. A method of rapidly densifying a ceramic matrix composite, the method comprising:
    enclosing a fiber preform within a tool comprising a tool inlet and a tool outlet;
    loading the tool into a furnace;
    connecting to the tool inlet to a feed line for delivery of a gas or liquid into the tool;
    flowing a first gas through the feed line and into the tool, the first gas being evenly distributed through the fiber preform and first gas reactants being deposited on fibers of the fiber preform as a fiber interface coating, thereby forming a coated fiber preform;
    flowing a second gas through the feed line and into the tool, the second gas being evenly distributed through the coated fiber preform and second gas reactants being deposited on fibers of the coated fiber preform as a CVI matrix coating, thereby forming a CVI coated fiber preform;
    flowing a molten material through the feed line and into the tool for melt infiltration of the CVI coated fiber preform, the molten material including particles such that infiltration with a slurry takes place during the melt infiltration; and
    cooling the furnace, the tool dropping below a solidification temperature of the molten material, thereby rapidly densifying a ceramic matrix composite.

19. A method of rapidly densifying a ceramic matrix composite, the method comprising:
    enclosing a fiber preform within a tool comprising a tool inlet and a tool outlet, the tool outlet containing a material that allows gas flow but blocks particulate and/or reacts with molten material to create a seal;
    loading the tool into a furnace;
    connecting to the tool inlet to a feed line for delivery of a gas or liquid into the tool;
    flowing a first gas through the feed line and into the tool, the first gas being evenly distributed through the fiber preform and first gas reactants being deposited on fibers of the fiber preform as a fiber interface coating, thereby forming a coated fiber preform;

flowing a second gas through the feed line and into the tool, the second gas being evenly distributed through the coated fiber preform and second gas reactants being deposited on fibers of the coated fiber preform as a CVI matrix coating, thereby forming a CVI coated fiber preform;

flowing a molten material through the feed line and into the tool for melt infiltration of the CVI coated fiber preform; and cooling the furnace, the tool dropping below a solidification temperature of the molten material, thereby rapidly densifying a ceramic matrix composite.

* * * * *